(12) United States Patent
Webb et al.

(10) Patent No.: US 7,449,124 B2
(45) Date of Patent: Nov. 11, 2008

(54) METHOD OF POLISHING A WAFER

(75) Inventors: Richard J. Webb, Inver Grove Heights, MN (US); John C. Clark, White Bear Lake, MN (US); Christopher J. Rueb, St. Paul, MN (US); John J. Gagliardi, Hudson, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/361,873

(22) Filed: Feb. 24, 2006

(65) Prior Publication Data

US 2006/0191872 A1      Aug. 31, 2006

Related U.S. Application Data

(60) Provisional application No. 60/656,517, filed on Feb. 25, 2005.

(51) Int. Cl.
   *C23F 1/00* (2006.01)
   *H01L 21/302* (2006.01)

(52) U.S. Cl. .............. 216/89; 216/88; 216/90; 216/91; 216/92; 438/692; 451/41

(58) Field of Classification Search .............. 216/88, 216/89, 90, 91; 438/692; 451/41
   See application file for complete search history.

(56) References Cited

U.S. PATENT DOCUMENTS

| | | | |
|---|---|---|---|
| 5,152,917 A | 10/1992 | Pieper et al. | |
| 5,958,794 A | 9/1999 | Bruxvoort et al. | |
| 6,194,317 B1 | 2/2001 | Kaisaki et al. | |
| 6,294,470 B1 | 9/2001 | Economikos et al. | |
| 6,368,969 B1 | 4/2002 | Economikos et al. | |
| 6,485,355 B1 | 11/2002 | Economikos et al. | |
| 6,569,769 B1 | 5/2003 | Economikos et al. | |
| 6,863,592 B2 * | 3/2005 | Lee et al. ............. 451/36 |
| 6,964,923 B1 * | 11/2005 | Ronay ............. 438/689 |
| 6,997,785 B1 * | 2/2006 | Rueb et al. ............. 451/41 |
| 7,238,618 B2 | 7/2007 | Mueller et al. | |

(Continued)

OTHER PUBLICATIONS

Tonshoff et al., "Abrasive Machining of Silicon", *Annals of the International Institution for Production Engineering Research*, vol. 39, 2, 1990, pp. 621-635.

(Continued)

*Primary Examiner*—Shamim Ahmed
(74) *Attorney, Agent, or Firm*—James A. Baker; Daniel D. Biesterveld

(57) ABSTRACT

A method for polishing a wafer comprising an aqueous solution having a pH in the range of 6 to 8, wherein the aqueous solution comprises at least one compound selected from the group consisting of a polymethacrylic acid, a polysulfonic acid, and combinations thereof, and wherein the compound is present in the range of 1.5 to 4 percent by weight of the aqueous solution. The wafer polishing solution can be adjusted to control cut rate and selectivity for modifying semiconductor wafers using a fixed abrasive CMP process.

17 Claims, 1 Drawing Sheet

U.S. PATENT DOCUMENTS

| | | |
|---|---|---|
| 2002/0059755 A1* | 5/2002 | Kido et al. .................... 51/309 |
| 2002/0092423 A1 | 7/2002 | Gillingham et al. |
| 2005/0050803 A1 | 3/2005 | Amanokura et al. |
| 2005/0076581 A1* | 4/2005 | Small et al. .................... 51/307 |
| 2005/0153643 A1* | 7/2005 | Simpson et al. ............. 451/526 |
| 2005/0191823 A1* | 9/2005 | Horikawa et al. ........... 438/424 |
| 2006/0196848 A1 | 9/2006 | Carter et al. |
| 2006/0234509 A1 | 10/2006 | Small et al. |

OTHER PUBLICATIONS

Kondo et al., "Syntheses of novel fluorocarbon surfactants with oxyethylene groups", *Journal of Fluorine Chemistry*, vol. 91 (1998) 147-151.

* cited by examiner

METHOD OF POLISHING A WAFER

RELATED APPLICATIONS

This application claims priority from provisional application Ser. No. 60/656,517 entitled "WAFER PLANARIZATION COMPOSITION AND METHOD OF USE," filed Feb. 25, 2005.

FIELD OF INVENTION

The present invention relates generally to a composition for modifying an exposed surface of a semiconductor wafer. More particularly, the present invention relates to a composition that can be adjusted to control cut rate and selectivity for modifying semiconductor wafers using a fixed abrasive chemical-mechanical planarization process.

BACKGROUND

During integrated circuit manufacture, semiconductor wafers used in semiconductor fabrication typically undergo numerous processing steps, including deposition, patterning, and etching steps. Details of these manufacturing steps for semiconductor wafers are reported by Tonshoff et al., "Abrasive Machining of Silicon", published in the Annals of the International Institution for Production Engineering Research, (Volume 39/2/1990), pp. 621-635. In each manufacturing step, it is often necessary or desirable to modify or refine an exposed surface of the wafer in order to prepare the wafer for subsequent fabrication or manufacturing steps. For example, semiconductor wafers having shallow trench isolation (STI) structures require planarization of the dielectric material prior to further processing.

One method of modifying or refining exposed surfaces of wafers employs processes that treat a wafer surface with a slurry containing a plurality of loose abrasive particles dispersed in a liquid. Typically this slurry is applied to a polishing pad and the wafer surface is then ground or moved against the pad in order to remove or take off material from the wafer surface. Generally, the slurry also contains agents that chemically react with the wafer surface. This type of process is commonly referred to as a chemical-mechanical planarization (CMP) process.

One limitation of CMP slurries, however, is that the slurry abrasive process must be carefully monitored in order to achieve a desired wafer surface topography. A second limitation is the mess associated with loose abrasive slurries. Another limitation is that the slurries generate a large number of particles that must be removed from the surface of the wafer and disposed of following wafer treatment. Handling and disposal of these slurries generates additional processing costs for the semiconductor wafer fabricator.

An alternative to CMP slurry methods uses an abrasive article to modify or refine a semiconductor surface. A CMP process that uses abrasive articles has been reported for example, by Bruxvoort et al. in U.S. Pat. No. 5,958,794 and by Kaisaki et al. in U.S. Pat. No. 6,194,317. The reported abrasive articles have a textured abrasive surface that includes abrasive particles dispersed in a binder. In use, the abrasive article is contacted with a semiconductor wafer surface, often in the presence of a fluid or liquid to provide a planar, uniform wafer surface. Use of an abrasive article overcomes some limitations associated with CMP slurries.

The present invention exploits the advantages afforded by the use of abrasive articles to modify surfaces of semiconductor wafers.

SUMMARY

The present invention relates generally to a composition for modifying an exposed surface of a semiconductor wafer. More particularly, the present invention relates to a composition that can be adjusted to control cut rate and selectivity for modifying semiconductor wafers using a fixed abrasive CMP process.

In one aspect, the present invention provides a method for polishing a wafer by providing a wafer comprising a first region comprising silicon dioxide and a second region comprising silicon nitride, contacting the wafer with a three-dimensional, textured, fixed abrasive article comprising a plurality of abrasive particles and a binder, and relatively moving the wafer and the fixed abrasive article in the presence of an aqueous solution having a pH in the range of 6 to 8, wherein the aqueous solution comprises at least one compound selected from the group consisting of a polymethacrylic acid, a polysulfonic acid, and combinations thereof, and wherein the compound is present in the range of 1.5 to 4 percent by weight of the aqueous solution.

The compositions and methods of the present invention unexpectedly enhance the performance of chemical mechanical planarization processes that use fixed abrasives rather than polishing pads and slurries.

In another aspect, the present invention provides a wafer planarization system comprising a working fluid according to the present invention and a three-dimensional, textured, fixed abrasive article comprising a plurality of abrasive particles and a binder. In some systems, the abrasive article comprises precisely shaped abrasive composites.

The above summary of the present invention is not intended to describe each disclosed embodiment or every implementation of the present invention. The Figures, detailed description, and claims that follow more particularly exemplify illustrative embodiments.

In the context of the present invention:

"abrasive composite" refers to one of a plurality of shaped bodies that collectively provide a textured, three-dimensional abrasive article comprising abrasive particles and a binder, wherein the abrasive particles may be in the form of abrasive agglomerates;

"fixed abrasive article" refers to an integral abrasive article that is substantially free of unattached abrasive particles except as may be generated during the planarization process;

"interact" with the wafer refers to an interaction that can be a polar interaction (e.g., van der Waals forces) or a chemical reaction;

"polymethacrylic acid" refers to polymers and copolymers of methacrylic acid, esters of acrylic acid and/or methacrylic acid;

"polysulfonic acid" refers to polymers and copolymers containing two or more sulfonic acid groups;

"precisely shaped abrasive composite" refers to an abrasive composite having a molded shape that is the inverse of the mold cavity that is retained after the composite has been removed from the mold, wherein the composite can be substantially free of abrasive particles protruding beyond the exposed surface of the shape before the abrasive article has been used, as described by Pieper et al. in U.S. Pat. No. 5,152,917;

"selectivity" refers to the ratio of the rate at which a first material dielectric material such as silicon dioxide) can be removed to the rate at which a second material (e.g., a barrier material such as silicon nitride) can be removed during a CMP process;

"textured abrasive article" refers to an abrasive article having raised portions and recessed portions in which at least the raised portions contain abrasive particles and binder;

"three-dimensional abrasive article" refers to an abrasive article having numerous abrasive particles extending throughout at least a portion of its thickness such that removing some of the particles during planarization exposes additional abrasive particles capable of performing the planarization function; and "wafer" refers to a semiconductor wafer in the form of a blank wafer (i.e., a wafer prior to processing for the purpose of adding topographical features such as metallized and insulating areas) or a processed wafer (i.e., a wafer after it has been subjected to one or more processing steps to add topographical features to the wafer surface).

These figures, which are idealized, are not to scale and are intended to be merely illustrative of the present invention and non-limiting.

DETAILED DESCRIPTION

Figure 1:
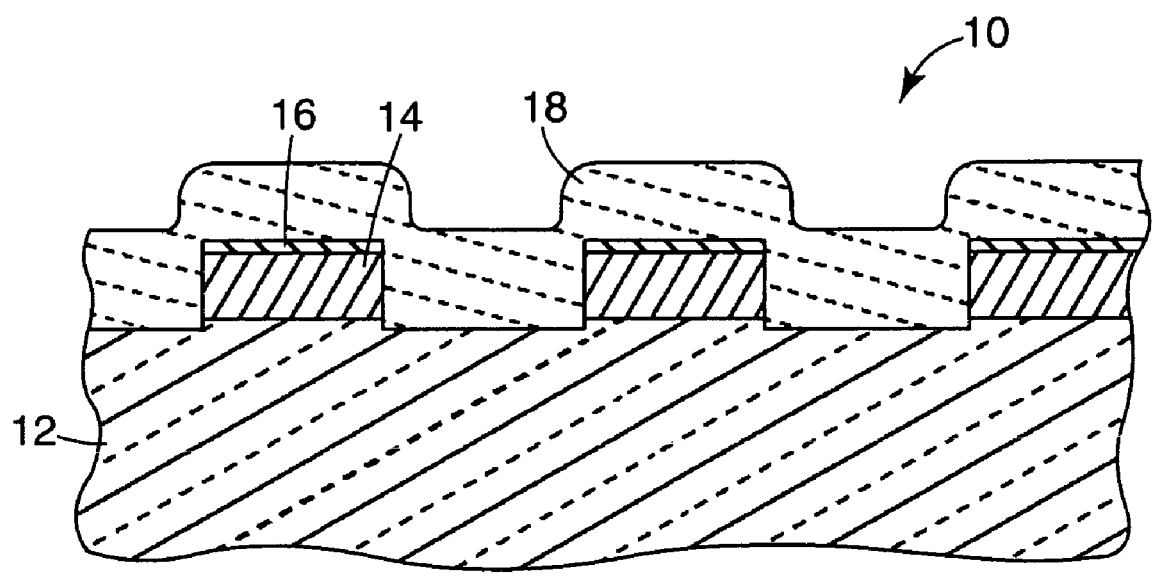
FIG. 1 is a schematic cross-sectional view of a portion of a structured wafer before surface modification.

FIG. 1 is a representative view of a patterned wafer 10 suitable for use in the process according to the present invention. For clarity, known features such as doped regions, active devices, epitaxial layers, carrier and field oxide layers have been omitted. Wafer 10 has a base 12 and a plurality of shallow trench isolation structures 14. The shallow trench isolation structures are typically formed by depositing and patterning a silicon nitride layer 16 to form a mask on the surface of the wafer, and then forming trenches using any of the etching processes known to those skilled in the art.

A dielectric layer 18 is deposited over the surface of the shallow trench isolation structures and into the spaces between the shallow trench isolation structures. A variety of dielectric materials may be used, such as, for example, silicon dioxide. As used in the context of the present invention, "silicon dioxide" refers to silicon dioxide as well as doped variants of silicon dioxide, such as, for example, fluorine, boron, and/or phosphorous doped silicon dioxide.

Figure 2:
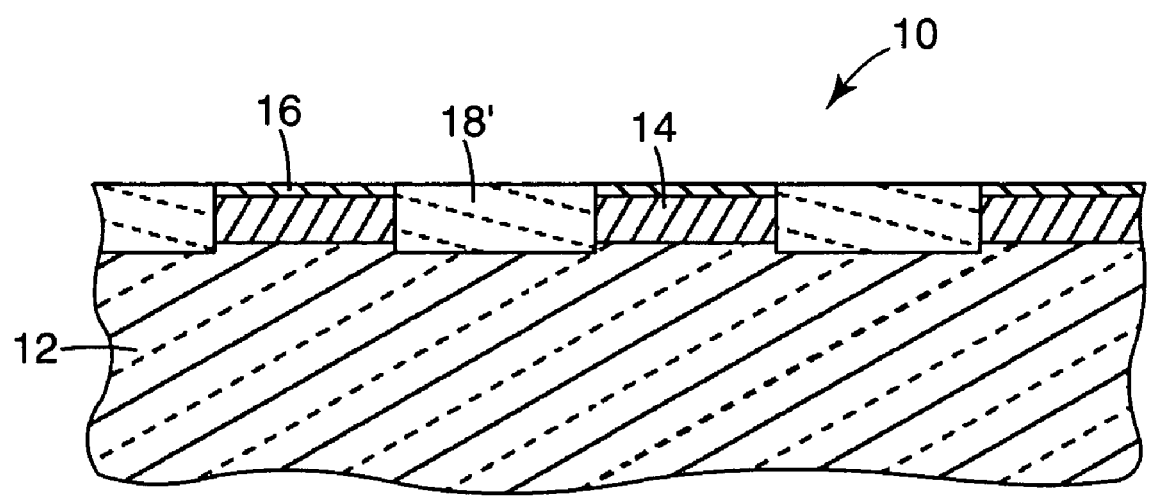
FIG. 2 is a schematic cross-sectional view of the structured wafer of FIG. 1 after surface modification using the present invention.

A portion of the dielectric layer 18 is then removed using the CMP process of the present invention to form the desired pattern illustrated in FIG. 2. As shown in FIG. 2, the polished dielectric material 18' and mask layer 16 form a generally flat surface. The mask layer functions as a stop layer for the CMP process that protects the shallow trench isolation structure 14 from exposure to the CMP processing.

CMP machines useful with the processes of the present invention are commercially available and known to those skilled in the art. An exemplary CMP machine is commercially obtained from Applied Materials, Santa Clara, Calif. and is marketed under the trade designation "APPLIED MATERIALS MIRRA CMP POLISHER". Alternative CMP machines are obtained from Obsidian, Inc., Fremont, Calif. and marketed under the trade designation "OBSIDIAN MODEL 501 CMP POLISHER".

The CMP machine useful for the process of the present invention is fitted with a fixed abrasive polishing article as reported, for example, by Bruxvoort et al. in U.S. Pat. No. 5,958,794 and by Kaisaki et al. in U.S. Pat. No. 6,194,317.

The abrasive article is used to polish the exposed surface of the wafer in the presence of a liquid medium (i.e., working liquid).

Abrasive articles useful for the method of the present invention typically have a diameter in the range of 250 to 1,000 millimeters.

The abrasive article may rotate between about 5 to 10,000 revolutions per minute. In some embodiments, the abrasive article rotates about 10 to 1,000 revolutions per minute. In some embodiments, the abrasive article rotates between about 10 to 250 revolutions per minute. In yet further embodiments, the abrasive article rotates between about 10 to 60 revolutions per minute.

In some embodiments, the abrasive article and the wafer are rotated in the same direction. In other embodiments, the wafer and the abrasive article are rotated in opposite directions.

The abrasive article can also be provided in other configurations, including, for example, sheets, rolls, or belts. In these configurations, the abrasive article can be fed linearly into the CMP process during polishing operations.

The abrasive article can be selected to be long lasting, e.g., the abrasive article can be selected, at least in part, to polish a minimum number of different wafers. The abrasive article can also be selected based on cut rate. Additionally, the abrasive article can be selected based on its capability of yielding a semiconductor wafer having a desired flatness, surface finish, and minimal dishing. The materials, desired texture, and process used to make the abrasive article can all influence whether or not these criteria are met.

Abrasive articles useful in the CMP process of the present invention include those reported by Bruxvoort et al. in U.S. Pat. No. 5,958,794 and by Kaisaki et al. in U.S. Pat. No. 6,194,317, incorporated herein by reference. In certain embodiments, a three-dimensional, textured, fixed abrasive article is used. In some embodiments, the abrasive article comprises ceria abrasive particles. In yet further embodiments, the abrasive articles comprise precisely shaped abrasive composites.

Exemplary abrasive articles having precisely shaped abrasive composites comprising ceria particles that are useful for the processes of the present invention include those commercially obtained from 3M Company, St. Paul, Minn., and marketed under the trade designation "3M SLURRYFREE CMP FIXED ABRASIVE 3152" and "3M SLURRYFREE CMP FIXED ABRASIVE 3154".

During CMP processing using the processes of the present invention, a working liquid is present at the interface between the abrasive article and the wafer. Typically, during planarization, there is a consistent flow of the working liquid to the interface between the abrasive article and the wafer. The liquid flow rate typically ranges between about 10 to 10,000 milliliters per minute. In some embodiments, the liquid flow rate is in the range of about 10 to 500 milliliters per minute. In yet further embodiments, the liquid flow rate is between about 25 to 250 milliliters per minute.

Working liquids useful in the present invention comprise a compound comprising at least one compound selected from the group consisting of a polymethacrylic acid, a polysulfonic acid, and combinations thereof. In this context, the combination of a polymethacrylic acid and a polysulfonic acid refers to a blend of two separate polymers, as well as a single polymer containing both methacrylic acid residues and at least two sulfonic acid groups. In some embodiments, the compound comprises an organic moiety comprising at least two functional groups that are capable of interacting with said wafer. Useful functional groups include carboxylic acids, sulfonic acids, or combinations thereof. In some embodiments, the at least two functional groups are identical. In some embodiments, the moiety comprises at least 5, or at least 10 functional groups.

Compounds of this type are known to be useful in stain blocker formulations. Exemplary formulations useful in the present invention include, for example, 3M Brand Protective Chemical SB-83, 3M Brand Stain Release FX-657, 3M Brand Protective Chemical FX-672, 3M Brand Stain Release FC-369, 3M Brand Stain Release FC-661, and 3M Brand Scotchgard Brand Protector PM-1875, all obtained from 3M Company, St. Paul, Minn. These formulations contain compounds comprising at least one compound selected from the group consisting of a polymethacrylic acid, a polysulfonic acid, and combinations thereof. Other stain blocker formulations known in the fabric and treatment art may also be useful in a working liquid and may include polymers containing phenol-formaldehyde, methacrylic acid, maleic acid, sulfonated fatty acids, and blends of the above.

The working liquid of the present invention may further comprise an amino acid. Amino acids that can be used with the process of the present invention include, for example, glycine, aspartic acid, glutamic acid, histidine, lysine, proline, arginine, cysteine, and tyronsine. In certain preferred embodiments, the working liquid comprises L-proline or histidine.

Processing parameters for the present invention can be selected to achieve desired removal rates and/or selectivity by the skilled person guided by this disclosure. For example, the composition, concentration, and the pH of the working liquid can be adjusted to control the removal rate of the dielectric material. In some embodiments, the composition is modified to control the removal rate of the dielectric material or the mask layer. In order to determine the concentration of a composition for the desired rate of removal or selectivity, a series of at least two working liquids having differing concentrations can be tested to determine the optimal concentration. Likewise, in order to determine the working liquid pH for the desired rate of removal or selectivity, a series of at least two working liquids having differing pH levels can be tested to determine the optimal pH level.

In some embodiments, the working liquid is adjusted to a pH of at least about 6. In some embodiments, the working liquid is adjusted to a pH of at least about 6.5. In some embodiments, the working liquid is adjusted to a pH that is no greater than about 8. In some embodiments, the working liquid is adjusted to a pH that is no greater than about 7.5. In some embodiments, the working liquid is adjusted to a pH in the range of about 6 to about 8. In some embodiments, the working liquid is adjusted to a pH in the range of about 6.5 to about 7.5. The pH can be adjusted using methods and solutions known to those skilled in the art, including, for example, the addition of KOH, NaOH, $NH_4OH$, HCl, $HNO_3$, or $H_2SO_4$. In some embodiments, the working liquid is buffered.

In some embodiments, the working liquid is selected to have a dielectric to barrier layer selectivity of at least 50. In other embodiments, the working liquid is selected to have a dielectric to barrier layer selectivity of at least 100. In other embodiments, the working liquid is selected to have a dielectric to barrier layer selectivity of at least 150. In yet further embodiments, the working liquid is selected to have a dielectric to barrier layer selectivity of at least 200.

In some embodiments, the working liquid is selected to have a dielectric removal rate of at least 500 angstroms per minute. In other embodiments, the working liquid is selected to have a dielectric removal rate of at least 800 angstroms per minute. In other embodiments, the working liquid is selected to have a dielectric removal rate of at least 1,000 angstroms per minute. In other embodiments, the working liquid is selected to have a dielectric removal rate of at least 1,500 angstroms per minute. In yet further embodiments, the working liquid is selected to have a dielectric removal rate of at least 2,000 angstroms per minute.

In some embodiments, the working liquid is selected to have a silicon nitride removal rate no greater than 25 angstroms per minute. In other embodiments, the working liquid is selected to have a silicon nitride removal rate no greater than 15 angstroms per minute. In yet further embodiments, the working liquid is selected to have a nitride removal rate no greater than 10 angstroms per minute.

In some embodiments, the working liquid is substantially fee of inorganic particulates, e.g., loose abrasive particles that are not associated with the fixed abrasive article. In some embodiments, the working liquid contains less than 1% by weight, or less than 0.1% by weight of inorganic particulates not associated with the fixed abrasive article.

Advantages and other embodiments of this invention are further illustrated by the following examples, but the particular materials and amounts thereof recited in these examples, as well as other conditions and details, should not be construed to unduly limit this invention. For example, composition and concentration of the working liquid can be varied. All parts and percentages are by weight unless otherwise indicated.

The material designations shown in TABLE 1 are used throughout the examples.

TABLE 1

| Designation | Material |
|---|---|
| PMA1 | Polymethacrylic acid - A 30% mixture of methacrylic acid (obtained from Sigma-Aldrich, St. Louis, Missouri) in water was polymerized in the presence of 3.4% ammonium persulphate (obtained from Sigma-Aldrich) based on weight of monomer and "RHODIA BRAND 3% RHODACAL LSS40/A" based on weight of monomer (obtained from Rhodia, Inc. of Cranbury, New Jersey) at 80° C. for 3 hours. The acid groups were neutralized with ammonium hydroxide by adding 5.8% by weight of monomer of a 28% $NH_4OH$ (obtained from Sigma-Aldrich) solution. Weight average molecular weight was determined to be less than 19,000 and number average molecular weight was approximately 10,000. |
| SB83 | "3M BRAND PROTECTIVE CHEMICAL SB-83" obtained from 3M Company, St. Paul, Minnesota |
| FX657 | "3M BRAND STAIN RELEASE FX-657" obtained from 3M Company. |
| SR-500 | Believed to be a styrene maleic anhydride copolymer (obtained from DuPont, Wilmington, DE) |
| FX672 | "3M BRAND PROTECTIVE CHEMICAL FX-672" obtained from 3M Company |
| FC369 | "3M BRAND STAIN RELEASE FC-369" obtained from 3M Company |
| FC661 | "3M BRAND STAIN RELEASE FC-661" obtained from 3M Company |
| SB1875 | "3M BRAND SCOTCHGARD BRAND PROTECTOR PM-1875" obtained from 3M Company |

Test Procedure I

A "3M BRAND SLURRYFREE CMP FIXED ABRASIVE 3154", obtained from 3M Company, St. Paul, Minn. was installed on an Obsidian 501 wafer polisher (Applied Materials, Inc., Santa Clara, Calif.). The subpad was a "3M BRAND SLURRYFREE CMP FIXED ABRASIVE P6900 RIBBED SUBPAD", also obtained from 3M Company. The ribbed subpad used 8 strips of 19 millimeter wide tape obtained from 3M Company and marketed under the trade designation "3M BRAND HIGH-TACK DOUBLE COATED POLYPROPYLENE TAPE 9443. The spacing between each rib center to center was 76 millimeters, the ribs were lined up parallel to the abrasive web and covered the entire Obsidian polish area.

The polishing chemistry, 125 ml per wafer, was poured onto the polishing area before each polish. Each wafer was polished for 60 seconds at 600 millimeters per second with a 6.35 millimeter fixed abrasive web advance between wafers. One TEOS wafer was polished followed immediately by one DRAM wafer. The TEOS wafers were 200 millimeter diameter blanket wafers coated with 1 micrometer of tetraethoxysilane. The STI level 0.17 micrometer DRAM wafers (obtained from Infineon Technologies, Dresden, Germany) had been previously polished through the active oxide layer to expose the nitride stop layer. The oxide and nitride film thicknesses, respectively, were measured for each wafer before and after polishing using a probe marketed under the trade designation "OPTIPROBE MODEL 2600", obtained from Thermawave, Fremont, Calif.

Test Procedure II

A "3M BRAND SLURRYFREE CMP FIXED ABRASIVE 3154", obtained from 3M Company, St. Paul, Minn. was installed on a "MIRRA CMP POLISHER", obtained from Applied Materials, Santa Clara, Calif. The fixed abrasive was attached to a 508 millimeter subpad marketed under the trade designation "3M BRAND SLURRYFREE CMP FIXED ABRASIVE P6900 SUBPAD", also obtained from 3M Company, using the pressure sensitive adhesive provided. The polishing chemistry was supplied to the polishing area at 250 milliliters per minute. Polishing occurred with a table speed of 30 revolutions per minute (rpm) and a wafer speed of 38 rpm in the same direction. The oxide and nitride film thicknesses, respectively, were measured for each wafer before and after polishing using a probe marketed under the trade designation "OPTIPROBE MODEL 2600", obtained from Thermawave, Fremont, Calif.

EXAMPLES

The aqueous solutions described in Table 2 were prepared and used to polish wafers as described in the Test Procedures above. The weight percentages indicated in the table were calculated on a solids basis. The pH was adjusted using NaOH or HCl.

TABLE 2

| Example Identification | Polishing Solution | Test Procedure | Wafer Pressure (kPa) | pH |
|---|---|---|---|---|
| Control 1 | Deionized Water | I | 17.2 | 7 |
| Example 1 | 2.5 wt % PMA1 | I | 17.2 | 7 |
| Example 2 | 2.5 wt % SB83 | I | 17.2 | 7 |
| Example 3 | 2.5 wt % PMA1 | I | 17.2 | 7 |
| Example 4 | 2.5 wt % FX657 | I | 17.2 | 6.5 |
| Example 5 | 2.5 wt % FX657 | I | 17.2 | 7 |
| Example 6 | 1.5 wt % FX657 | I | 17.2 | 7 |
| Example 7 | 3.5 wt % FX657 | I | 17.2 | 7 |
| Example 8 | 2.5 wt % FX657 | II | 20.7 | 7 |
| Comparative Example 9 | 2.5 wt % SR500 | II | 20.7 | 7 |
| Example 10 | 2.5 wt % FX672 | I | 17.2 | 7 |
| Example 11 | 2.5 wt % FC369 | I | 17.2 | 7 |
| Example 12 | 2.5 wt % FX661 | I | 17.2 | 7 |
| Comparative Example 13 | 1.0 wt % SB-1875 | I | 17.2 | 7 |
| Example 14 | 2.0 wt % SB-1875 | I | 17.2 | 7 |
| Example 15 | 2.5 wt % SB-1875 | I | 17.2 | 7 |

Oxide and nitride removal rates were determined as indicated in the Test Procedures and used to calculate a selectivity ratio as reported in Table 3.

TABLE 3

| Example or Comparative | Oxide Removal Rate (Å/min) | Nitride Removal Rate (Å/min) | Selectivity Ratio |
|---|---|---|---|
| Control 1 | 2108 | 557 | 4 |
| Example 1 | 1402 | 9.3 | 151 |
| Example 2 | 1861 | 9 | 207 |
| Example 3 | 2397 | 12 | 200 |
| Example 4 | 1163 | 11 | 106 |
| Example 5 | 1831 | 7 | 262 |
| Example 6 | 1754 | 8 | 219 |
| Example 7 | 1541 | 6 | 257 |
| Example 8 | 1394 | 8 | 174 |
| Comparative Example 9 | 802 | 5 | 160 |
| Example 10 | 1747 | 7 | 250 |
| Example 11 | 2118 | 12 | 177 |
| Example 12 | 1647 | 8 | 206 |
| Comparative Example 13 | 1311 | 10 | 131 |
| Example 14 | 1718 | 12 | 143 |
| Example 15 | 1902 | 12 | 159 |

The aqueous solutions described in Table 4 were prepared and used to polish wafers as described in the Test Procedures above. The weight percentages indicated in the table were calculated on a solids basis. The pH was adjusted using NaOH or HCl.

TABLE 4

| Example Identification | Polishing Solution | Test Procedure | Wafer Pressure (kPa) | pH |
|---|---|---|---|---|
| Control 2 | Deionized Water | I | 17.2 | 6 |
| Control 3 | Deionized Water | I | 17.2 | 7 |
| Control 4 | Deionized Water | I | 17.2 | 8 |
| Control 5 | Deionized Water | I | 17.2 | 9 |
| Comparative Example 16 | 1 wt % SB-1875 | I | 17.2 | 6 |
| Comparative Example 17 | 1 wt % SB-1875 | I | 17.2 | 7 |
| Comparative Example 18 | 1 wt % SB-1875 | I | 17.2 | 8 |
| Comparative Example 19 | 1 wt % SB-1875 | I | 17.2 | 9 |
| Example 20 | 2 wt % SB-1875 | I | 17.2 | 6 |
| Example 21 | 2 wt % SB-1875 | I | 17.2 | 7 |
| Example 22 | 2 wt % SB-1875 | I | 17.2 | 8 |
| Comparative Example 23 | 2 wt % SB-1875 | I | 17.2 | 9 |
| Example 24 | 2.5 wt % SB-1875 | I | 17.2 | 6 |
| Example 25 | 2.5 wt % SB-1875 | I | 17.2 | 7 |
| Example 26 | 2.5 wt % SB-1875 | I | 17.2 | 8 |
| Comparative Example 27 | 2.5 wt % SB-1875 | I | 17.2 | 9 |
| Example 28 | 3 wt % SB-1875 | I | 17.2 | 6 |
| Example 29 | 3 wt % SB-1875 | I | 17.2 | 7 |
| Example 30 | 3 wt % SB-1875 | I | 17.2 | 8 |
| Comparative Example 31 | 3 wt % SB-1875 | I | 17.2 | 9 |

Oxide and nitride removal rates were determined as indicated in the Test Procedures and used to calculate a selectivity ratio as reported in Table 5.

TABLE 5

| Example Identification | Oxide Removal Rate (Å/min) | Nitride Removal Rate (Å/min) | Selectivity Ratio |
|---|---|---|---|
| Control 2 | 1248 | | |
| Control 3 | 1135 | | |
| Control 4 | 1092 | | |
| Control 5 | 1248 | | |
| Comparative Example 16 | 940 | 8 | 118 |
| Comparative Example 17 | 1490 | 57 | 26 |
| Comparative Example 18 | 2415 | 611 | 4 |
| Comparative Example 19 | 3427 | 368 | 9 |
| Example 20 | 1052 | 11 | 96 |
| Example 21 | 1891 | 14 | 135 |
| Example 22 | 2661 | 578 | 5 |
| Comparative Example 23 | 3017 | 649 | 5 |
| Example 24 | 594 | 30 | 20 |
| Example 25 | 1518 | 10 | 152 |
| Example 26 | 2686 | 512 | 5 |
| Comparative Example 27 | 2934 | 520 | 6 |
| Example 28 | 415 | 20 | 21 |
| Example 29 | 1311 | 19 | 69 |
| Example 30 | 2569 | 690 | 4 |
| Comparative Example 31 | 2570 | 663 | 4 |

It is to be understood that even in the numerous characteristics and advantages of the present invention set forth in above description and examples, together with details of the structure and function of the invention, the disclosure is illustrative only. Changes can be made to detail, especially in matters of the composition and concentration of the working liquid and methods of use within the principles of the invention to the full extent indicated by the meaning of the terms in which the appended claims are expressed and the equivalents of those structures and methods.

What is claimed is:

1. A method for polishing a wafer comprising:
   providing a wafer comprising a first region comprising silicon dioxide and a second region comprising silicon nitride;
   contacting said wafer with a three-dimensional, textured, fixed abrasive article comprising a plurality of abrasive particles and a binder; and
   relatively moving said wafer and said fixed abrasive, article in the presence of a aqueous solution having a pH in the range of 6 to 8, wherein the aqueous solution contains less than 0.1% by weight of inorganic particulates not associated with the fixed abrasive article, further wherein said aqueous solution comprises at least one compound selected the group consisting of a polymethacrylic acid, a polysulfonic acid, and combinations thereof and wherein said compound is present in the range of 1.5 to 4 percent by weight of said aqueous solution.

2. The method of claim 1 wherein said first compound is in the range of 2 to 3 percent by weight of said liquid medium.

3. The method of claim 1 wherein said working medium has a pH in the range of 6.5 to 7.5.

4. The method of claim 1 wherein said first region overlies said second region.

5. The method of claim 1 further comprising relatively moving said wafer and said fixed abrasive article until at least a portion of said second region is exposed.

6. The method of claim 1 wherein said polishing comprises a silicon dioxide to silicon nitride selectivity of at least 50.

7. The method of claim 1 wherein said polishing comprises a silicon dioxide to silicon nitride selectivity of at least 100.

8. The method of claim 1 further comprising selecting said working medium to control at least one of silicon nitride removal rate and silicon dioxide to silicon nitride selectivity.

9. The method of claim 1 wherein said abrasive particles comprise ceria.

10. The method of claim 1 wherein said three-dimensional, textured, fixed abrasive article comprises precisely shaped abrasive composites.

11. The method of claim 1 wherein said working medium further comprises an amino acid.

12. The method of claim 1 wherein said aqueous solution is substantially free of loose abrasive particles.

13. The method of claim 1 wherein said polishing comprises a silicon dioxide removal rate of at least 800 angstroms per minute.

14. The method of claim 1 wherein said polishing comprises a silicon dioxide removal rate of at least 1,000 angstroms per minute.

15. The method of claim 1 wherein said polishing comprises a silicon dioxide removal rate of at least 1,500 angstroms per minute.

16. The method of claim 1 wherein said aqueous solution comprises polymethacrylic acid.

17. The method of claim 1 wherein said aqueous solution comprises polysulfonic acid.

* * * * *